(12) United States Patent  (10) Patent No.: US 6,300,823 B1
Zhou et al.  (45) Date of Patent: Oct. 9, 2001

(54) FILTER CIRCUIT

(75) Inventors: Changming Zhou, Tokyo; Kunihiko Suzuki, Saitama; Takashi Tomatsu, Kanagawa, all of (JP)

(73) Assignee: Yozan Inc., Tokyo (JP)

( * ) Notice: Subject to any disclaimer, the term of this patent is extended or adjusted under 35 U.S.C. 154(b) by 0 days.

(21) Appl. No.: 09/257,914

(22) Filed: Feb. 26, 1999

(30) Foreign Application Priority Data

Mar. 2, 1998 (JP) .................................................. 10-063933
May 1, 1998 (JP) .................................................. 10-137627
Jun. 23, 1998 (JP) .................................................. 10-192500

(51) Int. Cl.[7] ...................................................... H03K 5/00
(52) U.S. Cl. .......................... 327/551; 327/552; 708/317
(58) Field of Search ............................. 327/552, 94, 361, 327/337, 336, 407, 544, 551; 708/312

(56) References Cited

U.S. PATENT DOCUMENTS 5,872,466 * 2/1999 Shou et al. ............................. 327/94

* cited by examiner

*Primary Examiner*—Dinh T. Le
(74) *Attorney, Agent, or Firm*—Pillsbury Winthrop LLP

(57) ABSTRACT

A filter circuit comprises a plurality of sampling and holding circuits for sampling and holding analog input signal with a predetermined sampling period, a calculation circuit for multiplying each the analog input signal by a predetermined multiplier, and for summing the multiplication results. The sampling and holding circuits are controlled in an electrical power such that the electrical power is decreased when holding.

11 Claims, 15 Drawing Sheets

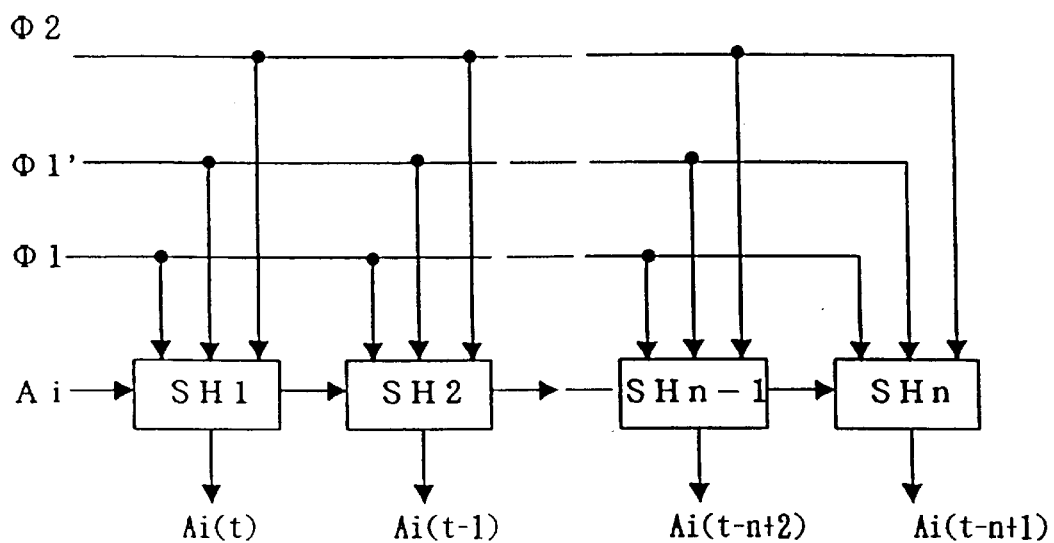
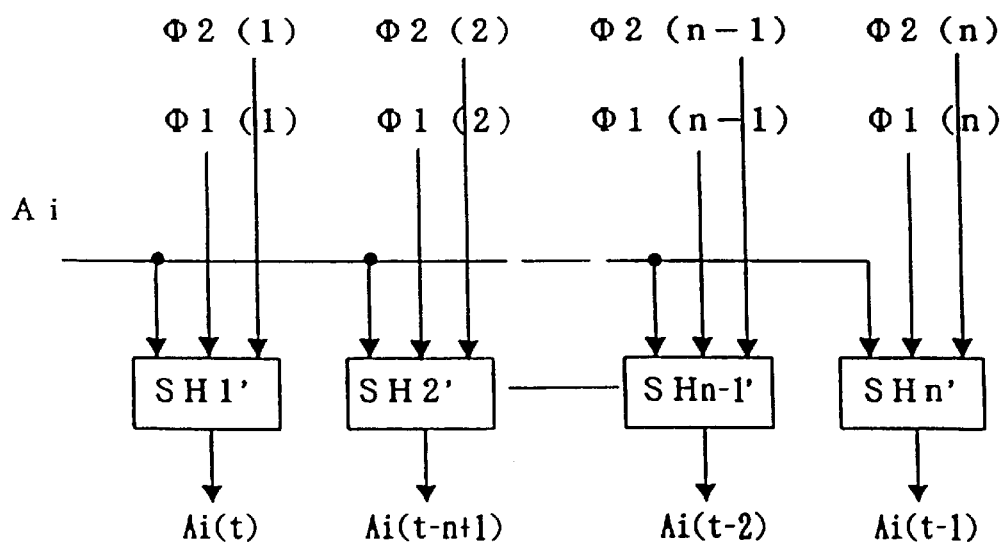

FIG. 18
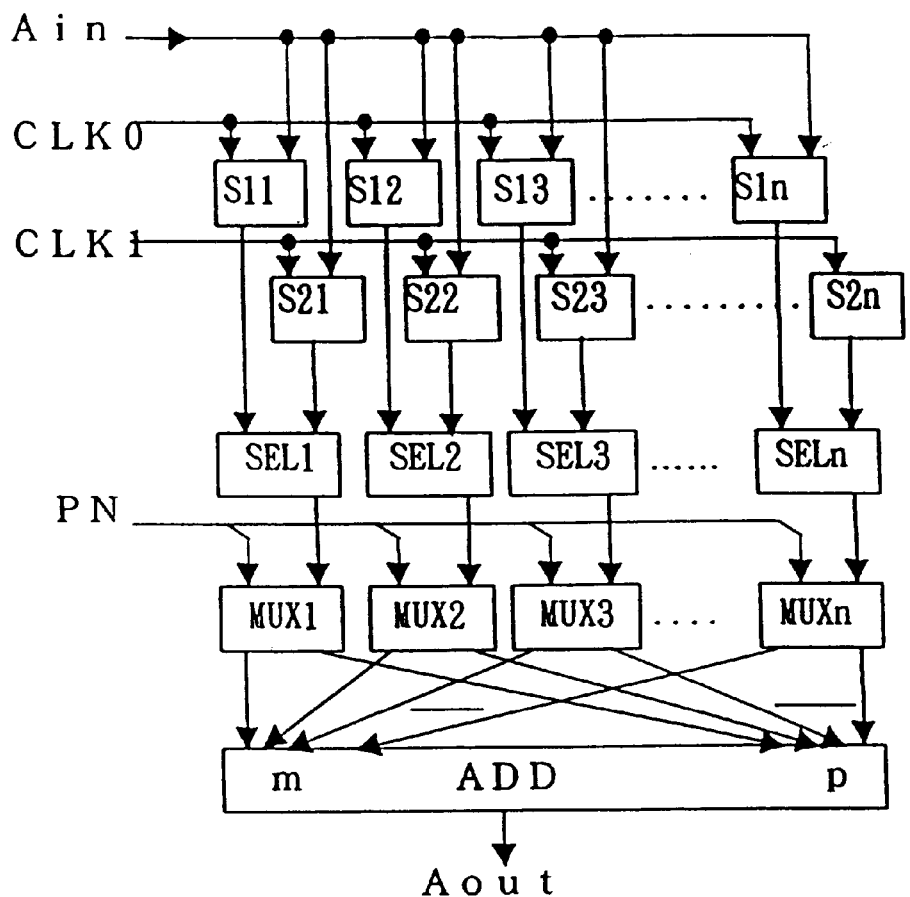
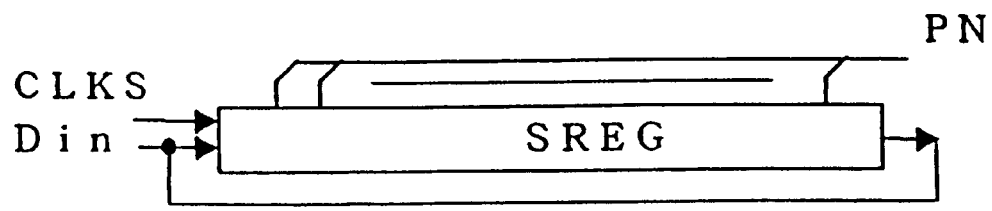

Fig.20
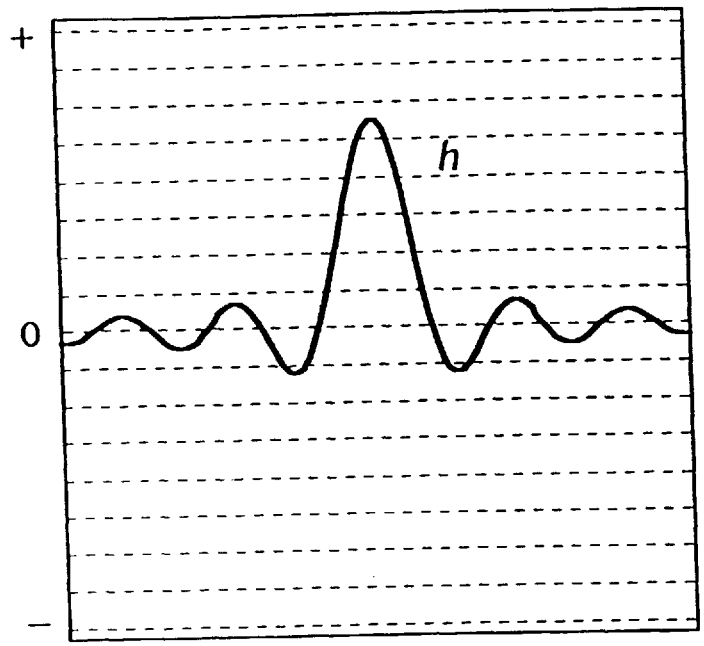
(a)
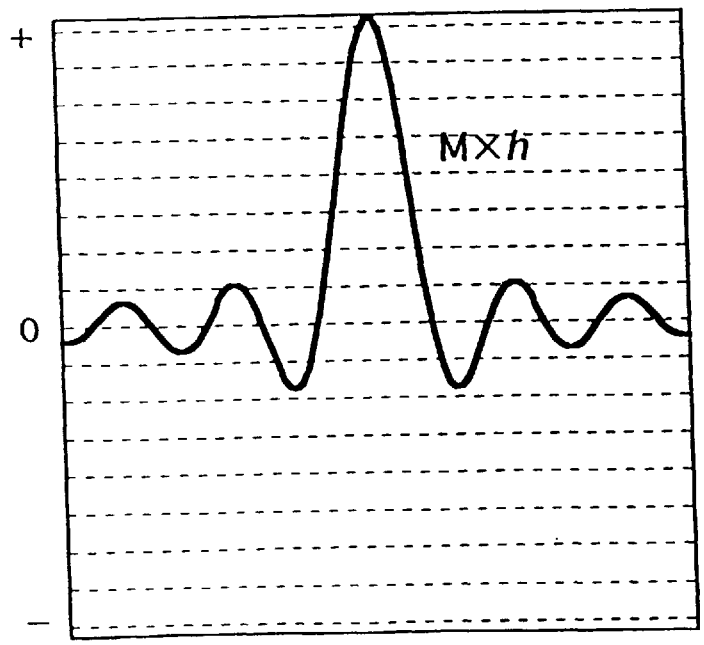
(b)

FILTER CIRCUIT

DETAILED DESCRIPTION OF THE INVENTION

BACKGROUND OF THE INVENTION

1. Field of the Invention

The present invention relates to a filter circuit, particularly to an analog-digital filter for multiplying an analog input signal by a digital multiplier.

2. Prior Art

In general, an analog filter consumes less electrical power than a digital filter, however, the analog filter has low controllability and accuracy as well as large deviation due to deviation of electronic elements. Usually, an analog signal is converted into a digital signal by an analog to digital (A/D) converter, and the digital signal is processed by a digital filter consisting of a digital signal processor (DSP). The processed digital data is converted again into an analog signal. Such digital filter has a high flexibility and high performance as a high order filter, however, the digital filter is of a large system size, high cost, large power consumption and low speed.

The inventors of the present invention proposed an analog digital filter (ADF) for multiplying an analog signal by a digital data. The analog input signal is directly controlled by a digital signal so that a multiplication of the analog signal by a digital signal is performed. The ADF is good in the calculation accuracy, in filter characteristics, in power consumption and in process speed.

FIG. 19 is circuit diagram of the ADF. In FIG. 19, $110_O$ to $110_{L-1}$ are sampling and holding circuits (S/H), $120_O$ to $120_{L-1}$ are multiplier registers and $130_O$ to $130_{L-1}$ are multiplication circuits (MUL). Sampled signals output from the sampling and holding circuits $110_O$ to $110_{L-1}$ are multiplied in the multiplication circuits $130_O$ to $130_{L-1}$ by digital data supplied from the multiplier registers $120_O$ to $120_{L-1}$. 140 is an adder for summing up outputs of the multiplication circuit $130_O$ to $130_{L-1}$. 150 is a scaler for multiplying an output of the adder 140 by a multiplier (coefficient). The output y(n) of the adder 140 is given by the following formula (1).

$$y(nT) = \sum_{k=0}^{L-1} h(kT) \cdot x(nT - kT) \quad (1)$$

Here, h: filter coefficient, x: input signal, n: an integer ($-\infty$ to $\infty$), T: sampling interval, and L: tap length.

Each of the multiplication circuits $130_O$ to $130_{L-1}$, the adder 140 and the scaler 150 includes an analog amplifier based on a CMOS inverter and a capacitance. The electric power is scarcely consumed because only little power is consumed in the CMOS inverters. The power consumption is not influenced by the frequency of the operation.

In order to prevent an over-range, the input signals to the multiplication circuits $130_O$ to $130_{L-1}$ are multiplied by $$\frac{1}{2^{N-1}},$$

and the input of the adder 140 is multiplied by $$\frac{1}{L}.$$

The scaler multiplies the output of the adder 130 by $2^{N-1} \cdot L$.

The filter coefficient h to be set in the multiplier registers 120 to 120 L-1 is quantized into N-bit data (8 bit, for example), that is, $(-2^{N-1} -1)$ to $(2^{N-1}-1)$. The filter coefficient is multiplied by M before the quantization for improving the accuracy.

FIG. 20(a) show the filter coefficient and FIG. 20(b) shows M times h (=M×h) so that the maximum value of the filter coefficient is limited to ($2^{N-1}$ 31 1) and stored in the registers $120_O$ to $120_{L-1}$. Then, the output of the adder 140 is multiplied by $$\frac{1}{M}.$$

However, the absolute value of (=M×h) may be different in the positive and negative sides from each other as shown in FIG. 20(b). The resolution of N-bit is not fully utilized.

Furthermore, a filter circuit of smaller circuit size and of less electrical power consumption is required.

SUMMARY OF THE INVENTION

The present invention has an object to provide a filter circuit of high accuracy.

The present invention has another object to provide a filter circuit of a small circuit size.

BRIEF DESCRIPTION OF DRAWINGS

FIG. 11 is block diagram showing a sampling and holding circuit of a filter circuit of a third embodiment;

FIG. 12 is a circuit diagram showing a sampling and holding circuit of a fourth embodiment;

FIG. 18 is a block diagram showing a filter circuit of third embodiment;

FIG. 20 is a graph showing a filter coefficient of the conventional analog digital filter.

PREFERRED EMBODIMENTS

Hereinafter, preferred embodiments of filter circuits according to the present invention are described with reference to the attached drawings.

Figure 1:
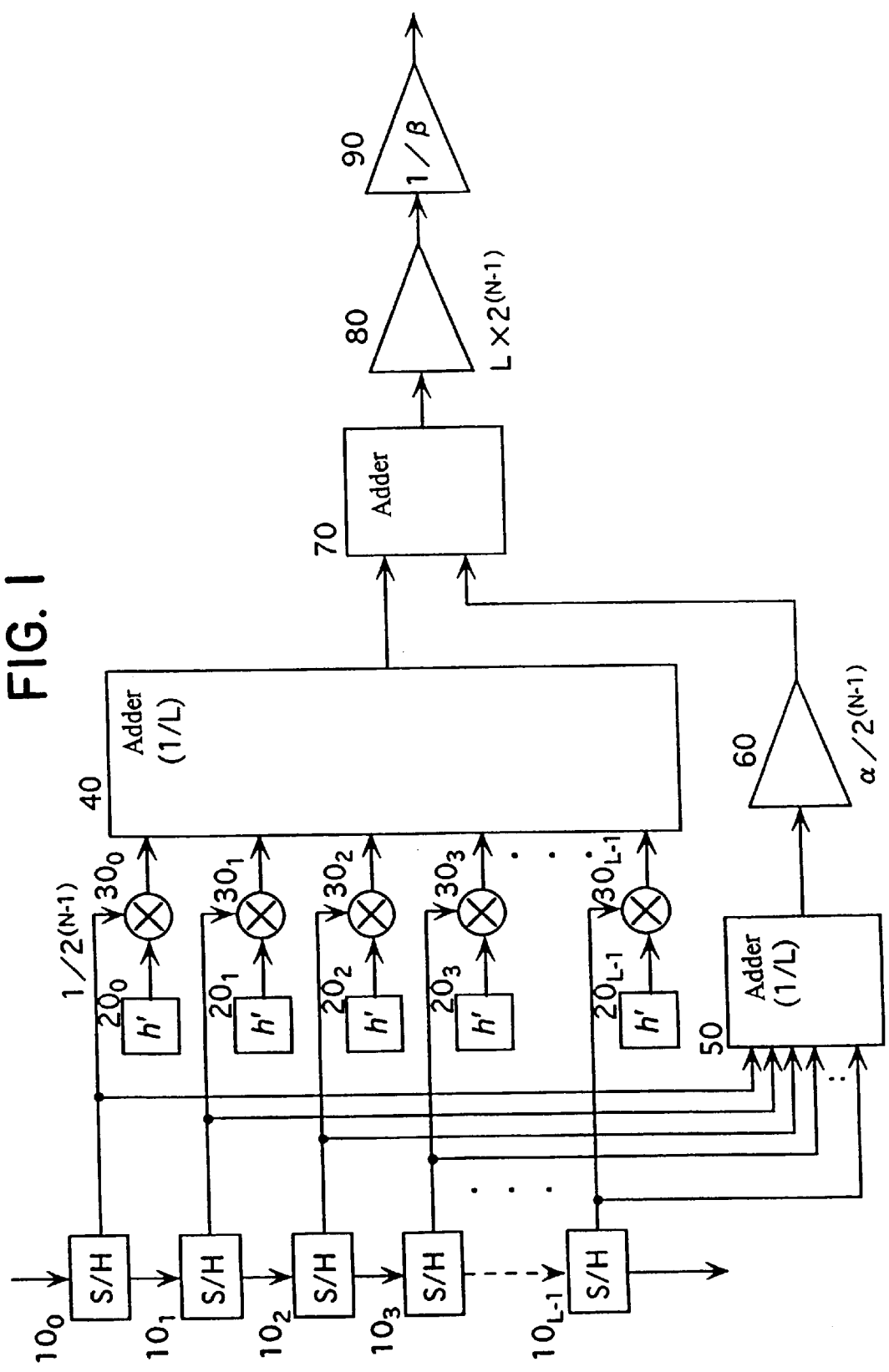
FIG. 1 is a block diagram showing an embodiment of an analog digital filter (ADF); according to the present invention FIGS. 2(a) and (b) are graphs showing a substitutive coefficient.

FIG. 1 is a block diagram showing an embodiment of an analog digital filter (ADF).

Figure 19:
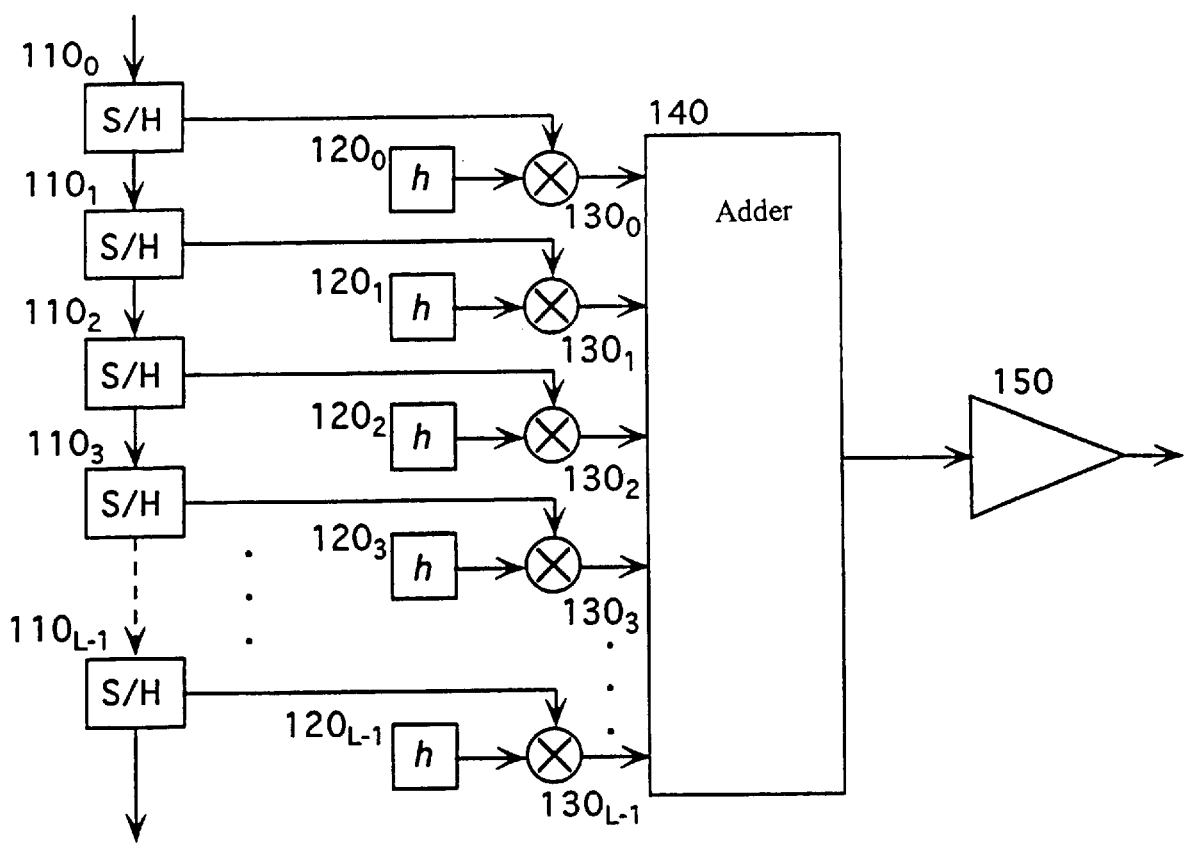
FIG. 19 is a block diagram showing the conventional analog digital filter.

In FIG. 1, $10_O$ to $10^{L-1}$ are sampling and holding circuits for sampling and holding an analog input signal, $20_O$ to $20_{L-1}$ are coefficient registers, $30_O$ to $30_{L-1}$ are multiplication circuits for multiplying the analog input signal by digital data stored in $20_O$ to $20_{L-1}$, and 40 is an adder for summing up outputs of the multilpication circuits $30_O$ to $30_{L-1}$ up, which are similar to those in the conventional ADF in FIG. 19. The coefficient registers $20_O$ to $20_{L-1}$ store a substitutive coefficient h' differently from the coefficient stored in the conventional coefficient resisters.

50 is an adder for summing up outputs of the sampling and holding circuits $10_O$ to $10_{L-1}$ up. 60 is a scaler for multiplying an output of the adder 50 by a multiplier $$\frac{\alpha}{2^{N-1}}.$$

70 is an adder for adding outputs of the adder 40 and the scaler 60. 80 is a scaler for multiplying the output of the adder 70 by a constant $L \times 2^{N-1}$. 90 is a scaler for multiplying the output of the adder 80 by a constant $$\frac{1}{\beta}.$$

Figure 2A:
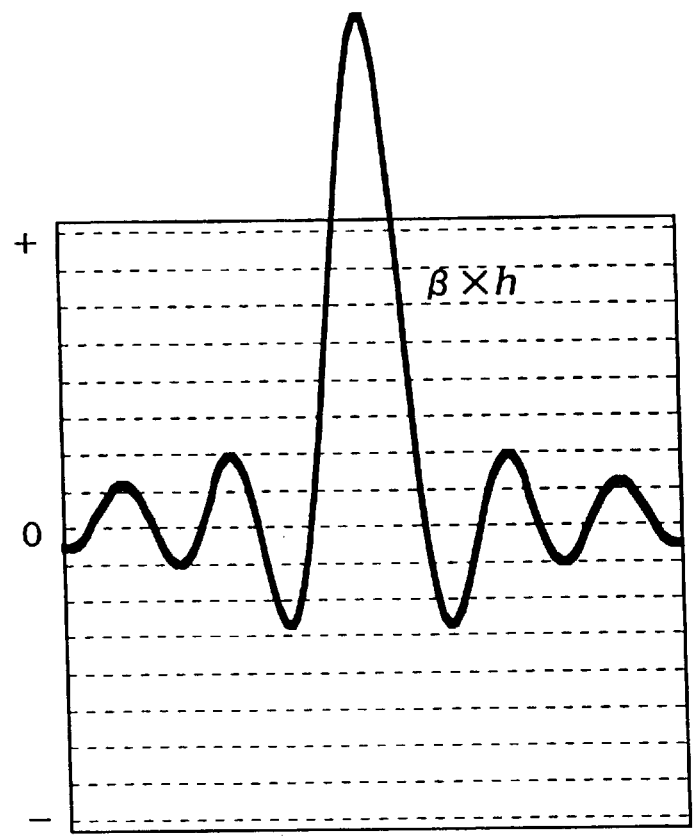
Figure 2B:
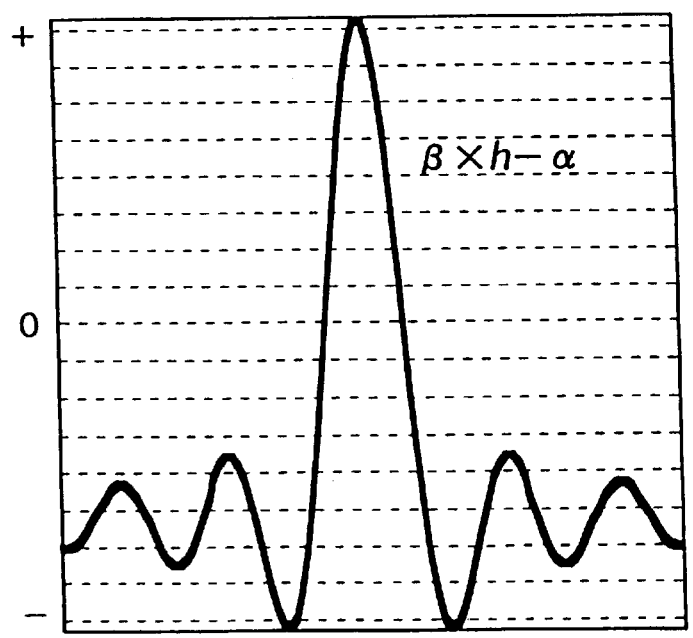

As shown in FIG. 2, a filter coefficient h similar to the conventional filter circuit is multiplied by a constant β so that the filter coefficient is extended to a value range corresponding to a full range of signed N-bit binary number, from $(-2^{N-1} -1)$ to $(2^{N-1} -1)$. The extended range has an upward offset and the lower area is not covered by the value range. As shown in FIG. 2(b), the value range is offset by "α" downwardly, then, the value range coincides with the full N-bit range. The formula (2) corresponds to the formula (1), showing the output with extension and offset caused by the substitutive filter coefficient "h".

$$y(nT) = \frac{1}{\beta}\left\{\sum_{k=0}^{L-1}(\beta \cdot h(kT) - \alpha) \cdot x(nT - kT) + \alpha\sum_{k=0}^{L-1}x(nT - kT)\right\} \quad (2)$$

Since, as mentioned above, the signal is multiplied by $$\frac{1}{2^{N-1}}$$

and by $$\frac{1}{N},$$

on multiplication and addition, respectively. The formula (2) is rewritten as in the formula (3).

$$y(nT) = \frac{L \times 2^{N-1}}{\beta}\left[\frac{1}{L}\sum_{k=0}^{L-1}\frac{1}{2^{N-1}}\{\beta \cdot h(kT) - \alpha\} \cdot x(nT - kT) + \frac{\alpha}{L \times 2^{N-1}}\sum_{k=0}^{L-1}x(nT - kT)\right] \quad (3)$$

The underlined term {β·h(kT)−α} is the substitutive filter coefficient "h", having the range of $(-2^{N-1}-1)$ to $(2^{N-1}-1)$.

The circuit in FIG. 1 performs the calculation of the formula (3). The coefficient registers $20_O$ to $20_{L-1}$ store the substitutive coefficient h'. The input signal sample output from the sampling and holding circuits $10_O$ to $10_{L-1}$ are multiplied by $$\frac{1}{2^{N-1}},$$

and multiplied by the substitutive coefficient h' in the multiplication, circuits $30_O$ to $30_{L-1}$. The outputs of the multiplication circuits $30_O$ to $30_{L-1}$ are inputs to the adder 40 which divides the outputs by L and then sums them up. The first term in the bracket of the formula (3) is output from the adder 40.

The adder 50 receives the outputs from the sampling and holding circuits $10_O$ to $10_{L-1}$, divides them by L, and sums them up. The output of the adder 50 is multiplied by $$\frac{\alpha}{2^{N-1}}$$

in the scaler 60 which outputs the second term in the bracket of the Formula (3).

The outputs of the adder 40 and the scaler 60 are added by the adder 70, and multiplied by $L \times 2^{N-1}$ in the scaler 80. The output of the scaler 80 is divided by β in the scaler 90. The adder 70 outputs the term in the bracket of the formula (3), and the scaler outputs the result of the formula (3).

When it is unnecessary to prevent the over-range, the multiplication circuits $30_O$ to $30_{L-1}$ multiply the input signal samples directly by the coefficient data h'. The scaler 60 multiplies the output of the adder 50 by α the scaler 60. The scaler 80 may be omitted.

As mentioned above, the analog digital filter according to the present invention performs the multiplication using a substitutive coefficient h' adjusted to the full N-bit range, thus a higher calculation accuracy is obtained.

Figure 3:
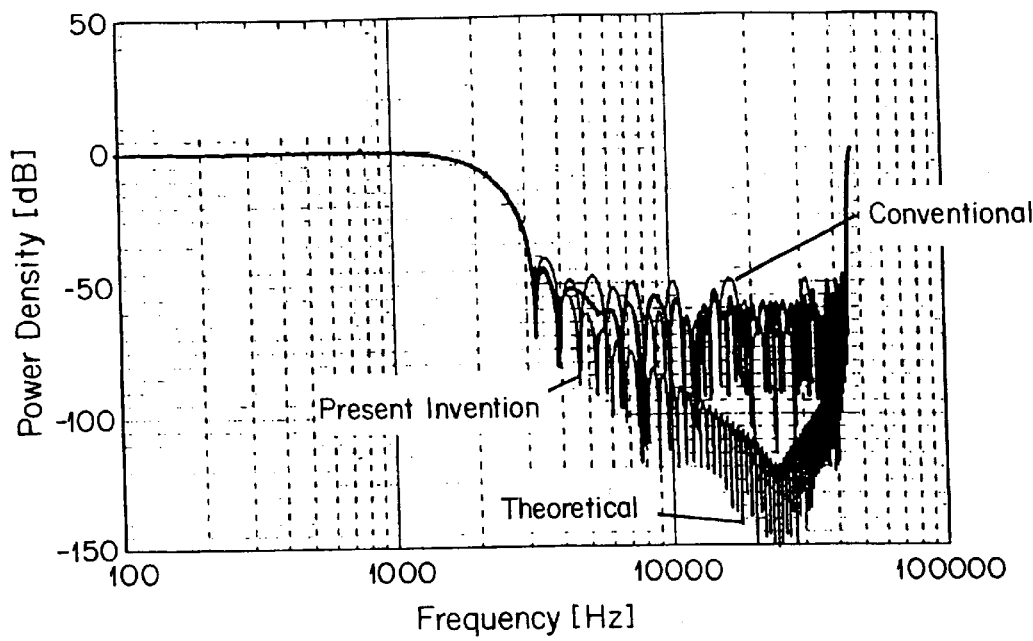
FIG. 3 is a graph showing characteristic relationship between power density and frequency, obtained by a simulation, of the filter circuit of the present invention and the conventional filter circuit.
Figure 4:
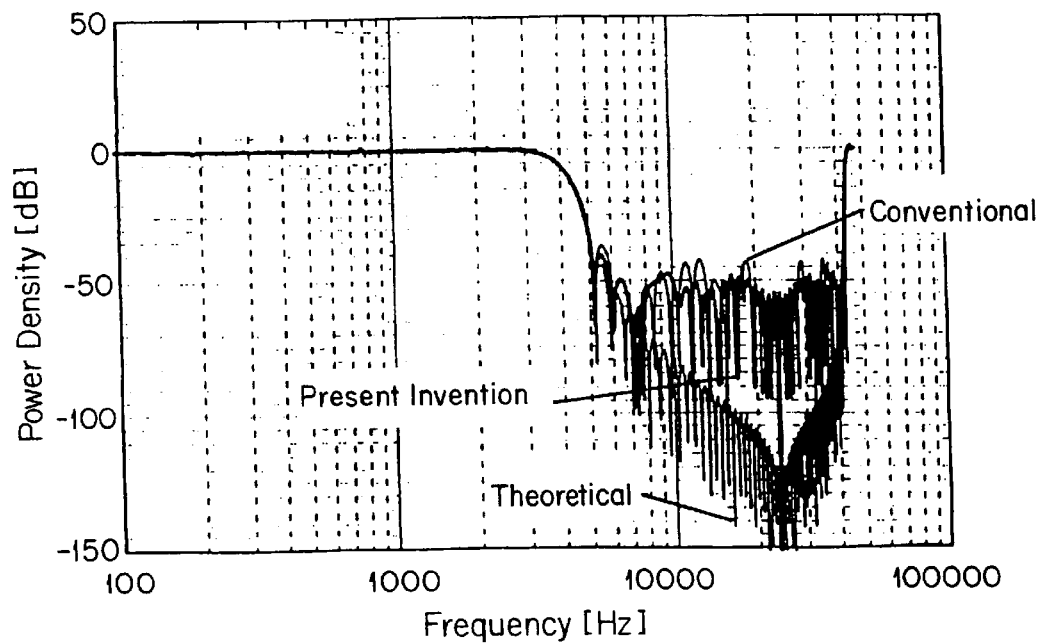
FIG. 4 is graph showing another characteristic relationship between power density and frequency, obtained by a simulation, of the filter circuit of the present invention and the conventional filter circuit.
Figure 5:
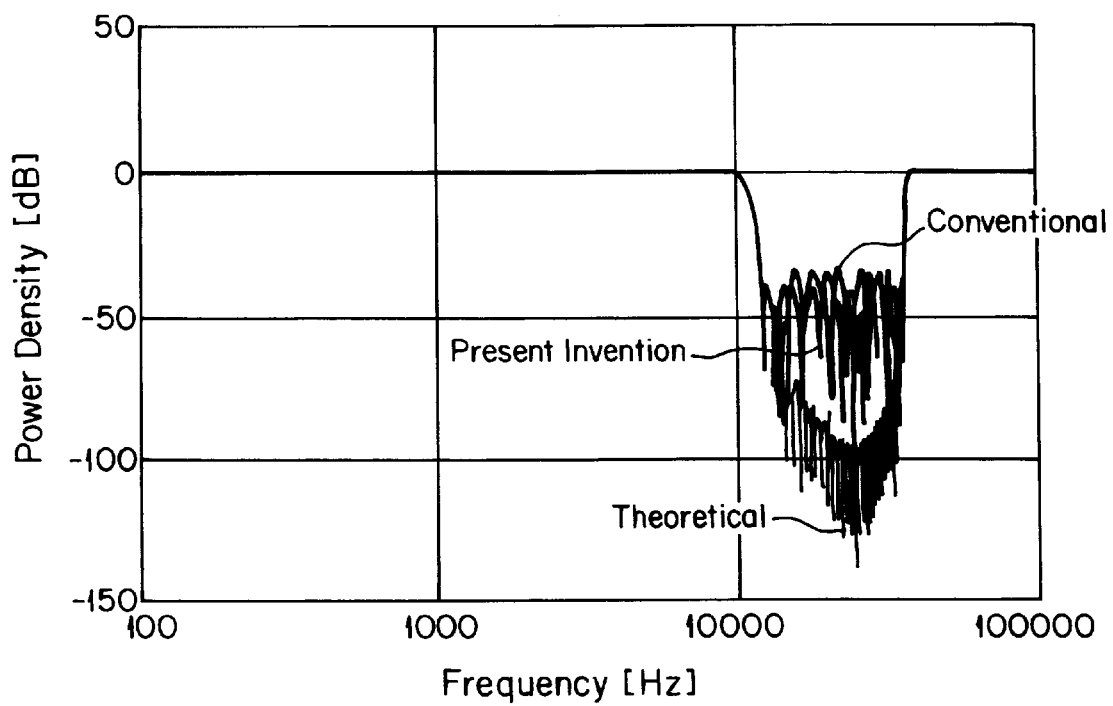
FIG 5. is a graph showing further another characteristic relationship between power density and frequency, obtained by the simulation, of the filter circuit of the present invention and the conventional filter circuit.

FIGS. 3 to 5 are graphs showing characteristic relationship between power density and frequency, obtained by a simulation, of the filter circuit of the present invention and the conventional filter circuit. The input signal is a white noise. A sampling frequency of 48kHz is used in these simulations. The cut-off frequency is different, that is, 2kHz in FIG. 3, 4 kHz in FIG. 4, and 11 kHz in FIG. 5. The cut-off area attenuation is improved by about 5db by the analog digital filter according to the present invention compared with the conventional filter.

The above circuits can be applicable to any multiplication circuits such as a convolver of fixed decimal data.

Figure 6:
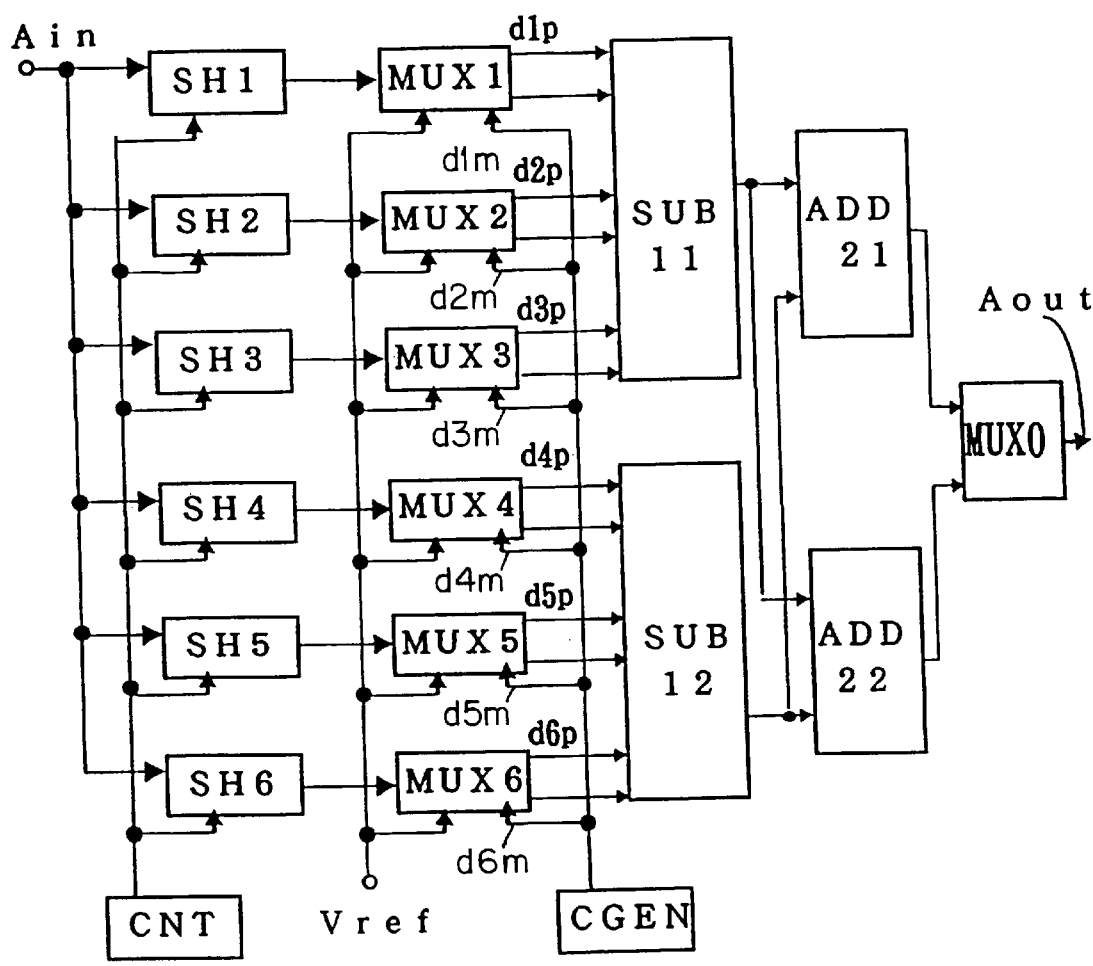
FIG. 6 is a block diagram showing a second embodiment of a filter circuit according to the present invention.

FIG. 6 is a block diagram showing a second embodiment of a filter circuit according to the present invention. This embodiment is used as a matched filter.

A plurality of sampling and holding circuits SH1 to SH6 are connected in parallel to an analog input signal Ain for successively receiving Ain one after another at a predetermined timing in response to a control signal CNT. In this case, the data transfer between the adjacent sampling and holding circuits is not necessary, so a transfer error is prevented. The multipliers to be multiplied to the sampled data are shifted and circulated. Outputs of the sampling and holding circuits SH1 to SH6 are inputs to one inputs of corresponding three-inputs-two-outputs multiplexers MUX1 to MUX6, respectively, to which 1-bit multipliers are input from a multiplier register CGEN. A reference voltage Vref is input to the other inputs of the multiplexers MUX1 to MUX6. Each of the multiplexers MUX1 to MUX6 outputs the corresponding input voltage at one output and the reference voltage at the other output in response to the multiplier. The multipliers are shifted and circulated so that a predetermined relationship between the input data and the multipliers is obtained.

Here, the multiplexers output pairs of outputs d1p and d1m, d2p and d2m, . . . , d6p and d6m, the multipliers are m1, m2, . . . , m6. The analog input voltage is introduced to djp (j=1 to 6) and Vref is introduced to djm (j=1 to 6) when mj (j=1 to 6) is "1", otherwise the input voltage is introduced to djm and Vref is introduced to djp. The output Aout of the matched filter is expressed in the formula (4).

$$Aout = \sum_{j=1}^{6}(djp - djm) \cdot (-1)^{1-mj} \tag{4}$$

The outputs of the multiplexers MUX1 to MUX3 are inputs to subtraction circuit SUB11, and the outputs of the multiplexers MUX4 to MUX6 are input to a subtraction circuit SUB12. The subtraction circuits SUB11 and SUB12 output the following outputs as expressed in the formulae (5) and (6).

$$SUB11 = -\sum_{j=1}^{3}(djp - djm) \cdot (-1)^{1-mj} \tag{5}$$

$$SUB12 = -\sum_{j=4}^{6}(djp - djm) \cdot (-1)^{1-mj} \tag{6}$$

The subtraction results are added in the adder ADD21 and the additon results shown in the formula (1) is obtained. When a refreshing is not needed, the output of the adder ADD21 is used as Aout. When a refreshing is required, a second adder ADD22 similar to ADD21 is provided, and ADD21 and ADD22 are alternatively used and alternatively refreshed. A multiplexer MUX0 is used for selecting one output from ADD21 (while is not refreshed).

Figure 7:
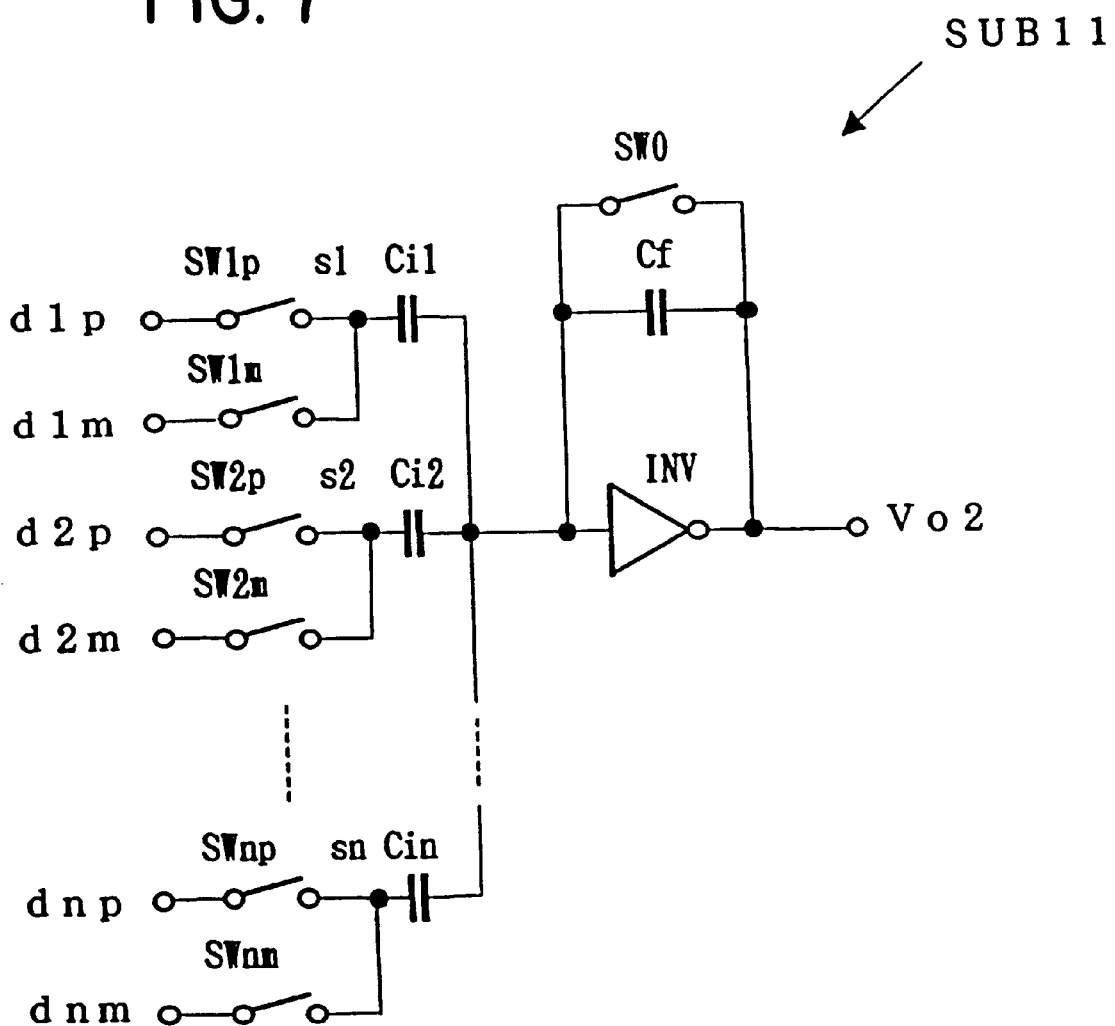
FIG. 7 is a circuit diagram showing a subtraction circuit in the second embodiment.

FIG. 7 is a circuit diagram showing the subtraction circuit SUB12 used in the second embodiment in which the number of inputs is generalized to be "n". The data d1p and d1m of the first input pair are connected to switches SW1p and SW1m at their inputs, respectively, which are commonly connected at their outputs to an input capacitance Ci1. Another capacitance's output and input of the input capacitance Ci1 is connected to an inverting amplifier INV, the outputs of which are connected through a feedback capacitance Cf to its input. A refresh switch SWO is connected between the input and output of the inverting amplifier INV for short-circuiting the feedback capacitance Cf. When the switches SW1p and SWO are closed and the switch SW1m is opened, an electrical charge Q is charged in the capacitance Ci1, as shown in the formula (7). Here, Vx is the static operating point voltage of the inverting amplifier INV.

$$Q1 = (d1p - Vx) \cdot Ci1 \tag{7}$$

Next, when the switch SW1m is closed and the switches SW1p and SWO are opened, an electrical charge Q2 is charged in the capacitance Ci1, as shown in the formula (8). Here, Vo2 is an output voltage of the inverting amplifier INV.

$$Q2 = (d1m - Vx) \cdot Ci1 + (Vo2 - Vx) \cdot Cf \tag{8}$$

According to the principle of preservation of electrical charge, Q1=Q2. Provided that voltage Vx is equal to Vref then, the following formula (9) is obtained.

$$Vo2 - Vref = \frac{Ci1}{Cf}(d1p - d1m) \tag{9}$$

The formula (9) defines a subtraction of d1m from d1p. It means that a subtraction is realized in a time-sharing manner by the switches SW1p, SW1m, SWO, the input capacitance Ci1, the inverting amplifier INV and the feedback capacitance Cf.

For the second to the nth input pairs d2p and d2m, d3p and d3m, . . . , dnp and dnm, there are provided switch pairs SW2p and SW2m, SW3p and SW3m, . . . , SWnp and SWnm, respectively, similar to the first pair. Input capacitances Ci2 to Cin are connected to outputs of the switch pairs SW2p and SW2m, SW3p and SW3m, . . . , SWnp and SWnm, respectively. Outputs of the input capacitances Ci2 to Cin are connected to the input of the inverting amplifier INV parallel to the input capacitance Ci1. Therefore, the output voltage Vo2 of the inverting amplifier INV caused by the total input pairs is as shown in the formula (10).

$$Vo2 - Vref = \frac{\sum_{j=1}^{n} Cij}{Cf}(d1p - d1n) \tag{10}$$

Since the number of the input capacitances Ci1 to Cin is equal to the number of the input pairs and only one of the inverting amplifier INV is necessary, the circuit size is small. When the switch SW0 is closed, the electrical charge of the feedback capacitance Cf is cancelled. This is a refreshing of the subtraction circuit SUB11, and it is unnecessary to stop the subtraction calculation for the refreshing.

The subtraction circuit SUB12 is similar to SUB11, the description therefor is omitted.

Figure 8:
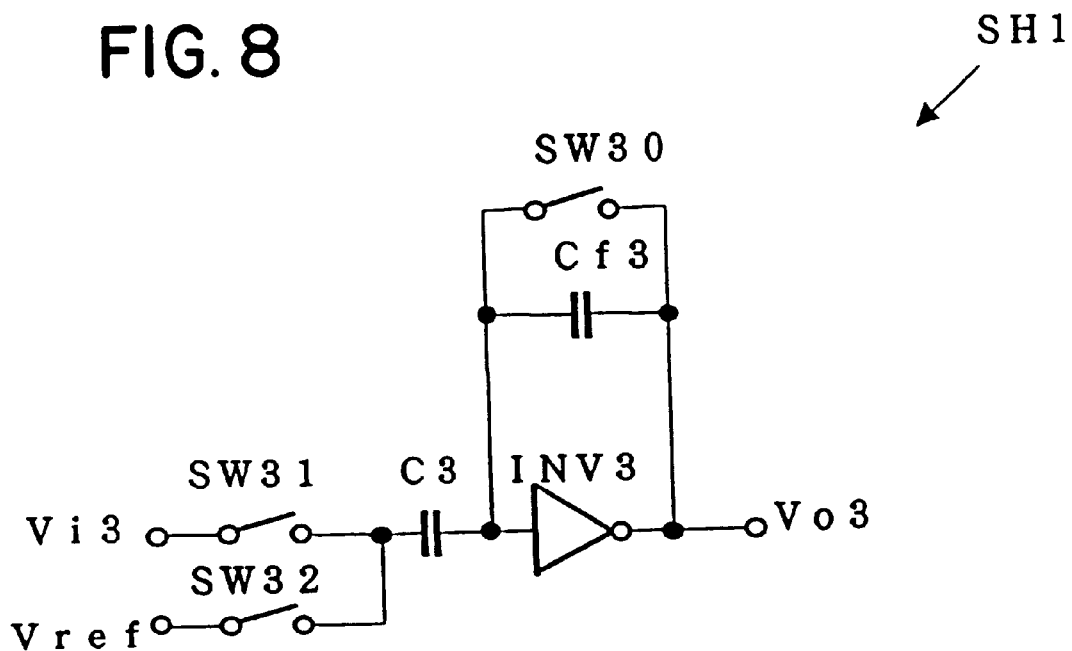
FIG. 8 is a circuit diagram showing a sampling and holding circuit in the second embodiment.

FIG. 8 is a circuits diagram showing the sampling and holding circuit SH1 in FIG. 6. An input voltage Vi3 corresponding to the input voltage Ain in FIG. 6 is connected to the switch SW31 at its input, the output of which is connected to an inverting amplifier INV3. The output of the inverting amplifier INV3 is connected through a feedback capacitance Cf3 to its own input. A refresh switch SW30 is connected between the input and output of the inverting amplifier INV3 for short-circuiting the feedback capacitance Cf3. A switch SW32 is connected to the input of the inverting amplifier INV3, parallel to the switch SW31, for connecting the reference voltage Vref to the input when refreshing. When SW31 is opened after being once closed, the voltage Vi3 is held by the sampling and holding circuit SH1. Vo3 is inverted by an inverter when non-inverted output is necessary, because Vo3 is an inversion of Vi3. Otherwise, the outputs of the subtraction circuits may be inverted.

The sampling and holding circuits SH2 to SH6 are similar to SH1, the descriptions therefor are omitted.

Figure 9:
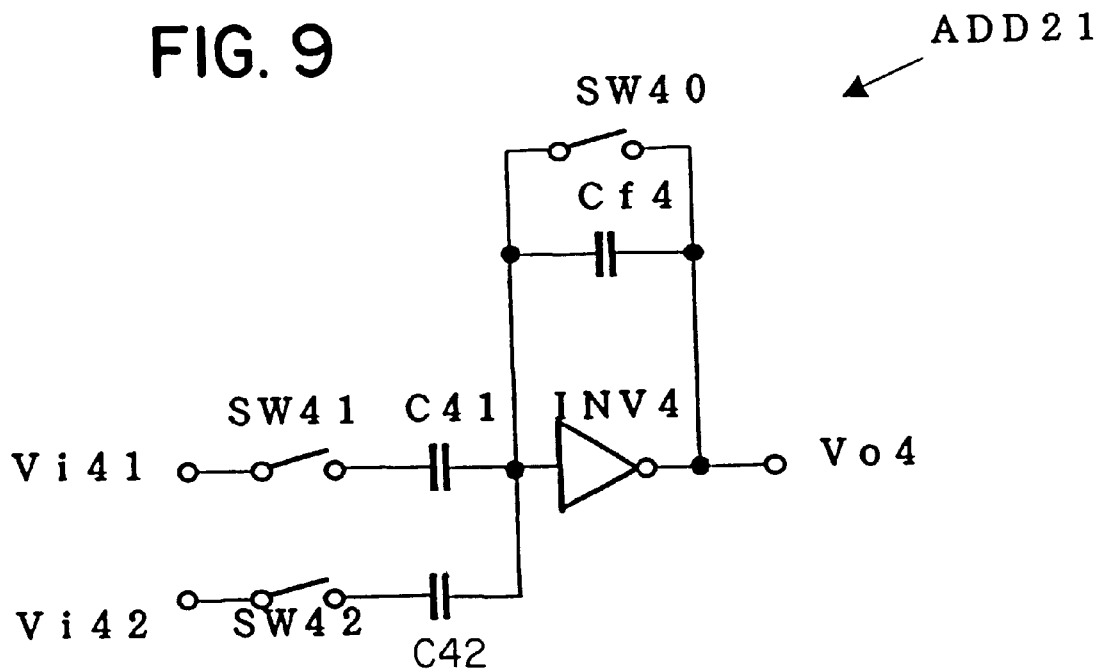
FIG. 9 is a circuit diagram showing an adder in the second embodiments.

FIG. 9 is a circuit diagram showing the adder ADD21 of the second embodiment. Two inputs Vi41 and Vi42 are connected to switches SW41 and SW42, respectively, outputs of which are connected to inputs of capacitances C41 and C42, respectively. The capacitances C41 and C42 are commonly connected at their outputs to an inverting amplifier INV4. The output of the inverting amplifier INV4 is connected through a feedback capacitance Cf4 to its own input. A refresh switch SW40 is connected between the input and output of the inverting amplifier INV4 for short-circuiting the feedback capacitance Cf4. When static operating point voltage of the inverting amplifier INV4 is Vref, an output voltage of the adder ADD21 is expressed as in the formula (11).

$$Vo4 - Vref = -\frac{(Vi41 - Vref) \cdot C41 + (Vi42 - Vref) \cdot C42}{Cf4} \quad (11)$$

The adder ADD22 is similar to ADD21, so the description therefor is omitted.

Figure 10:
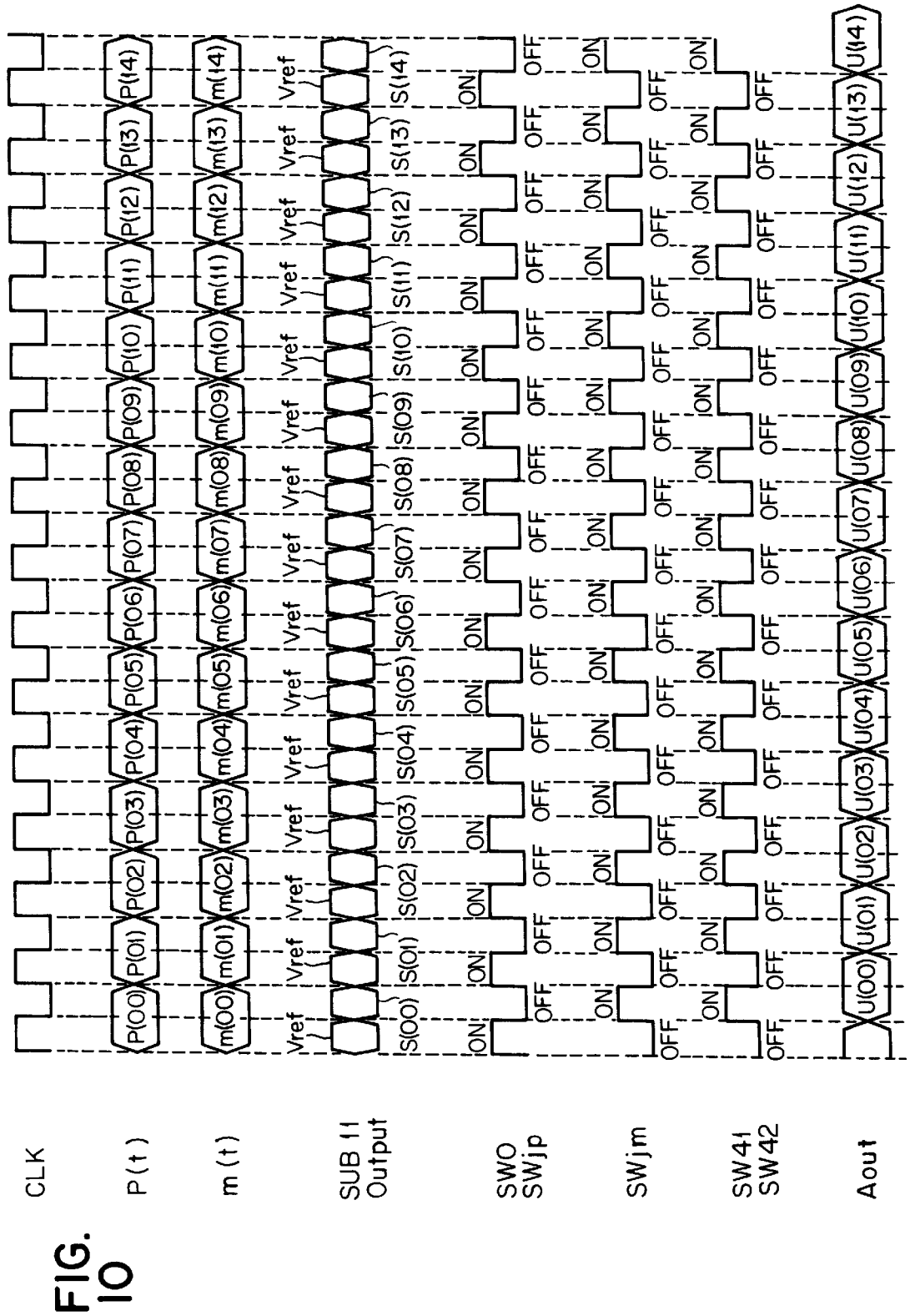
FIG. 10 is a timing chart of the second embodiment.

FIG. 10 is a timing chart of the second embodiment. In FIG. 10, CLK is a clock for switching the switches SW31 and SW32, P(t) is an input representing d1p to dnp, and m(t) is an input representing d1m to dnm. In the first half of each pulse of the clock CLK, the refreshing is performed, the output of SUB11 is Vref, and an electric charge corresponding to P(t) is charged in the capacitances. In the latter half of the pulse of the clock CLK, the output of SUB11 becomes the subtraction result. The switches SW0 and SWjp are synchronous with the clock CLK and the switch SWjm are reversed in phase with respect to SWjp. The switches SW41 and SW42 are reversed in phase with respect to CLK for keeping the output S(t) until the next output period of P(t). As a result, only the final calculation data is output and invalid data during calculation is prevented from being output.

FIG. 11 is block diagram showing one sampling and holding circuit of a filter circuit of a third embodiment.

In FIG. 11, a plurality of sampling and holding circuits SH1 to SHn are serially connected., and an input voltage Ai is input to the first stage SH1. Clock signals Φ1, Φ1' and Φ2 are inputs to each sampling and holding circuits SH1 to SHn. The clock signal Φ1 determines a sampling and holding timing of the sampling and holding circuits SH1 to SHn. The clock signal Φ1' determines a transfer timing of the sampling and holding circuits SH1 to SHn. The clock signal Φ2 controls the power supply of the sampling and holding circuits SH1 to SHn.

FIG. 12 is a circuit diagram showing the sampling and holding circuit of a fourth embodiment.

In FIG. 12, a plurality of sampling and holding circuits SH1' to SHn' are connected in parallel to an input voltage Ai, and clock signals Φ1 and Φ2 are input to each sampling and holding circuits SH1' to SHn'. The clock signal Φ1 determines a sampling and holding timing of the sampling and holding circuits SH1' to SHn', and the clock signal Φ2 controls the power supply of the sampling and holding circuits SH1' to SHn'.

Figure 13:
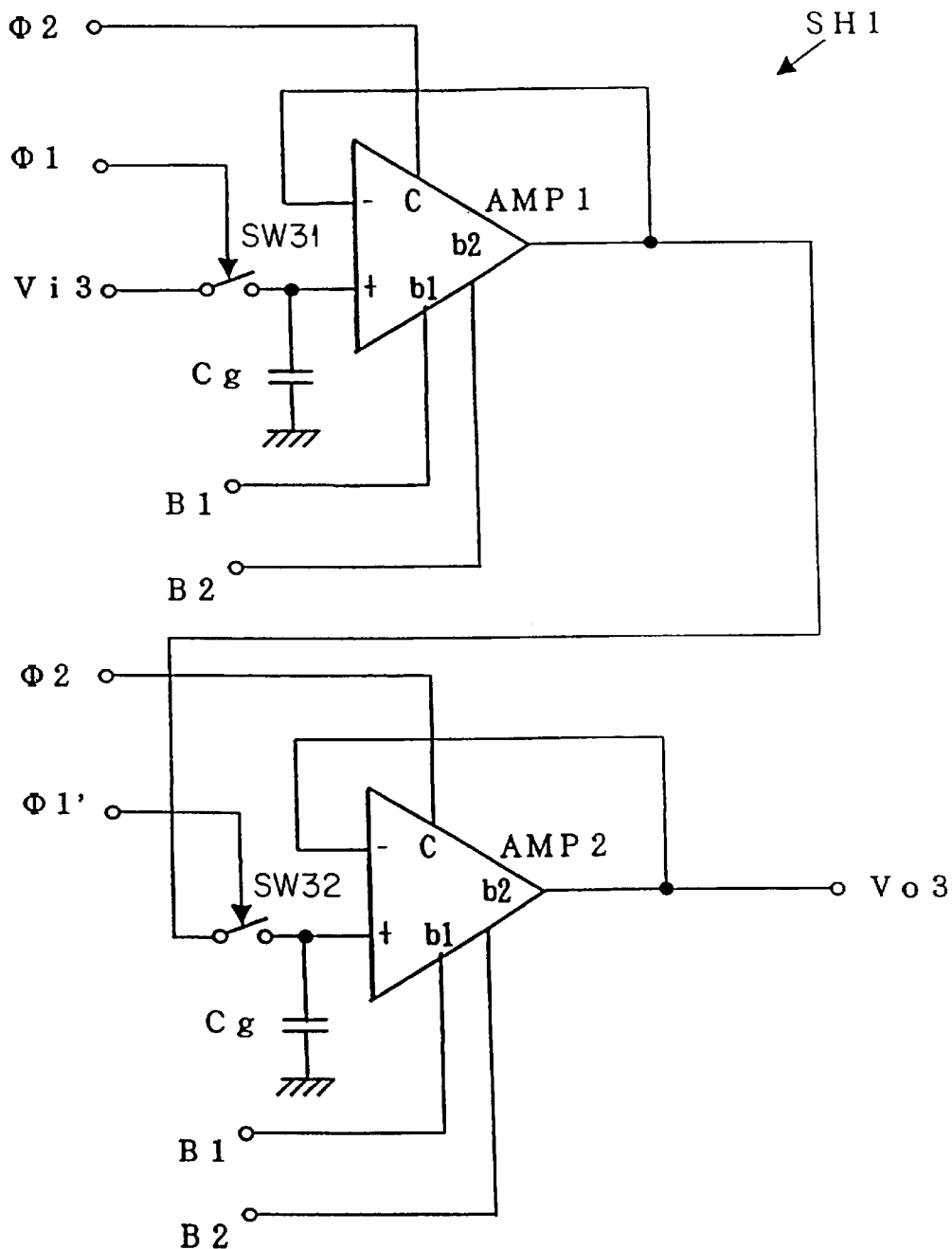
FIG. 13 is a circuit diagram showing one sampling and holding circuit included in the circuit of FIG. 11.

FIG. 13 is a circuit diagram showing one sampling and holding circuit included in the circuit of FIG. 11. The sampling and holding circuit SH1 includes FET operational amplifiers AMP1 and AMP2 outputs of which are connected to their own inverted inputs respectively. Non-inverted inputs of AMP1 and AMP2 are connected to switches SW31 and SW32, the output of AMP1 is connected through SW32 to AMP2. An input voltage Vi3 corresponding to Ai in FIG. 11 is connected to SW31. The switch SW31 and SW32 are controlled by Φ1 and Φ1', respectively. Grounded capacitances Cg are connected to the non-inverted inputs of AMP1 and AMP2 respectively, for holding voltages when SW31 and SW32 are opened, respectively. The clock Φ2 is input to AMP1 and AMP2 for alternatively selecting bias voltages B1 and B2, Vi3 is held by Cg at a timing SW31 is opened. The held voltage is transferred to the next stage through the output of AMP2 when SW32 is closed. The switch SW31 is opened for preventing an influence of the previous stages when the output is transferred.

The sampling and holding circuits SH2 to SHn are similar to SH1, the descriptions are omitted.

Figure 14:
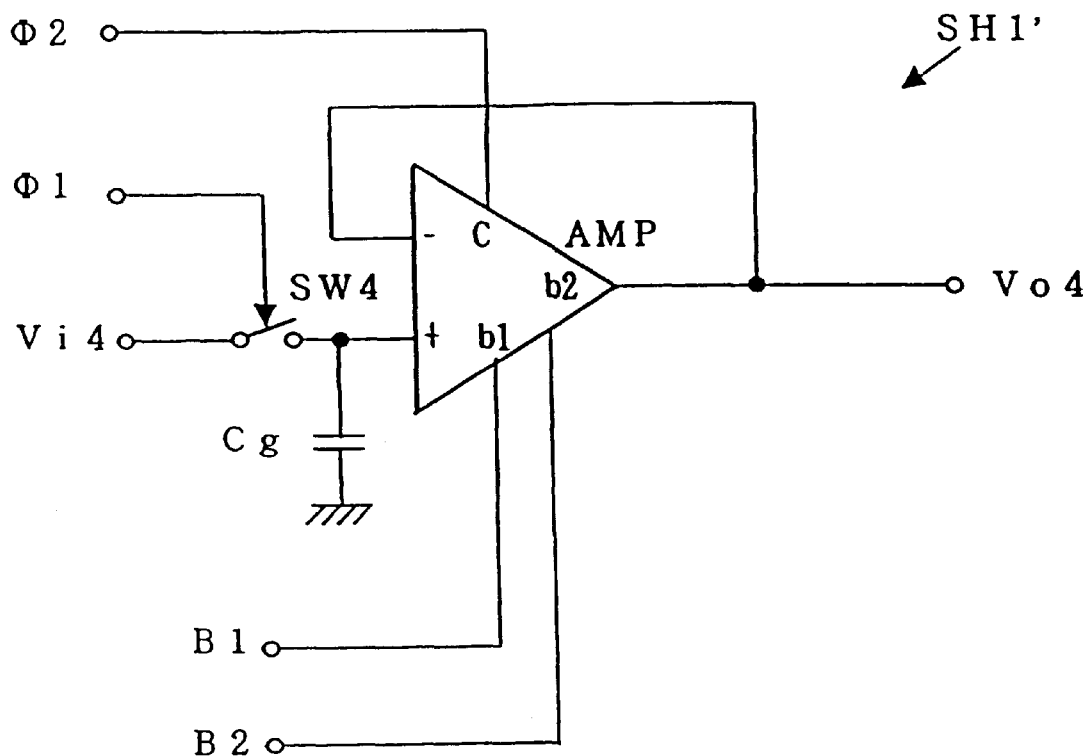
FIG. 14 is a circuit diagram showing one sampling and holding circuit included in the circuit of FIG. 12.

FIG. 14 is a circuit diagram showing one sampling and holding circuit included in the circuit of FIG. 12. The sampling and holding circuit SH1 includes a FET operational amplifier AMP, output of which is connected to its own inverted input. The non-inverted input of AMP is connected to a switch SW4, an input voltage Vi4 corresponding to Ai in FIG. 12 is connected to SW4. The sampling and holding circuits have different sampling timing from one another, so that SH1' to SHn' successively receive Ai one after another. The switch SW4 is controlled by Φ1, and a grounded capacitance Cg is connected to the non-inverted input of AMP for holding voltages when SW4 is opened. The clock Φ2 is input to AMP for alternatively selecting bias voltages B1 and B2.

Figure 15:
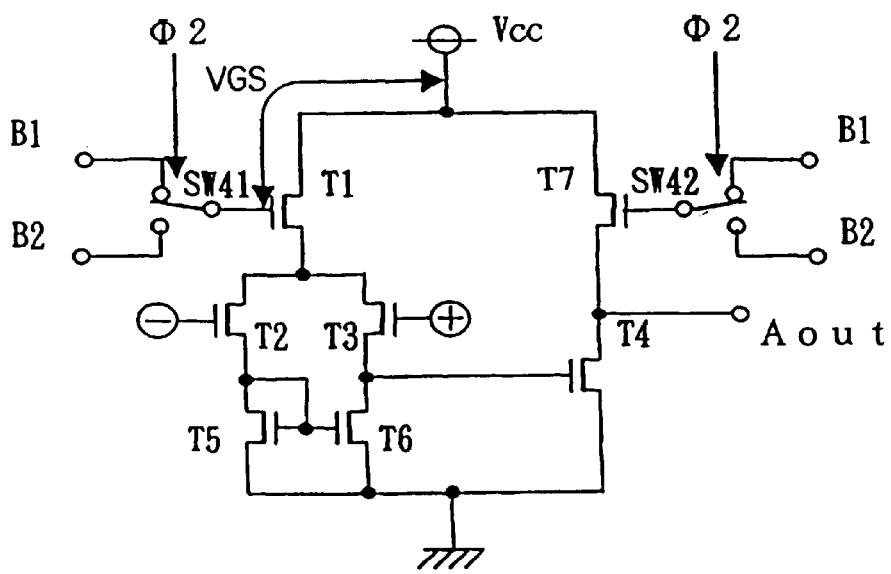
FIG. 15 is a circuit diagram showing an operational amplifier included in the circuit of FIG. 11.

FIG. 15 is a circuit diagram showing the operational amplifier included in the circuit of FIG. 11.

In FIG. 15, a differential amplifying pair circuit is constructed by a MOS transistor T2, a gate of which is connected to the inverted input (shown by "−") and a MOS transistor T3, a gate of which is connected to the non-inverted input (shown by "+"). T2 and T3 are connected at one of their terminals through a MOS transistor T1 to a supply voltage Vcc, and are connected at other terminals to a current mirror circuit consisting of MOS transistors T5 and T6. An output of T3 is input to a gate of a MOS transistor T4, one terminal of which is connected through a current source MOS transistor T7 to the supply voltage Vcc.

The gate of the transistor T1 is connected to a bias switch SW41 with two inputs and one output, to which the bias voltages B1 and B2 are inputs. A gate of the transistor T7 is connected to a bias switch SW42 of two inputs and one output, to which the bias voltages B1 and B2 are input. The bias switches SW41 and SW42 are controlled by the clocks Φ2 and B1 or B2 is alternatively connected as the gates of T1 or T7. If T1 and T7 are formed to be the same size with each other, one bias switch is commonly used for both transistors T1 and T2. The circuit size is diminished.

The sampling and holding circuits in FIGS. 11 to 15 need current until the output becomes stable from the time of sampling new analog data by the closed switch SW31 or SW4, and then, little current is consumed while holding the data. If B2 is higher than B1, B2 is selected during sampling and B1 is selected during holding.

Figure 16:
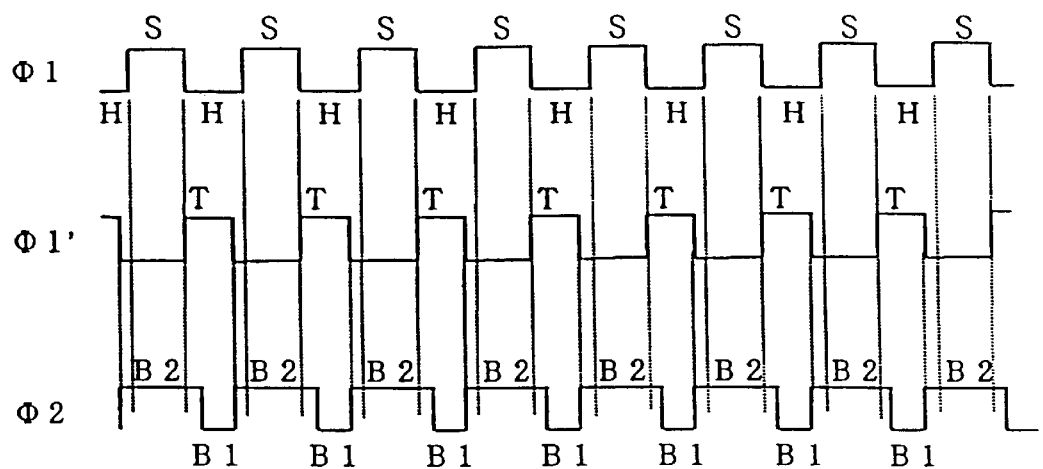
FIG. 16 is a timing chart of a switch in FIG. 11.

FIG. 16 is a timing chart showing the clocks Φ1, Φ1 ', and Φ2 in FIG. 11. As for the clocks Φ1, "S" indicates the sampling period and "H" indicates the holding period. As for Φ1', "T" indicates the transfer period. As for the clocks Φ2, "B1" indicates the energizing period of the bias "B1", "B2" indicates the energizing period of the bias "B2". The period "B2" redundantly includes the sampling period "S", that is, periods just before and just after the sampling period are also included. A sufficient current is supplied to during the sampling period without fail. In the period "B1", the supply current is minimized in order to decrease the power consumption. Since it is necessary that the switch SW31 is opened during transferring, and new data is received after the data transfer is completed, the trailing edge of Φ1 and the leading edge of Φ1' are synchronized with each other. Thereafter, the leading edge of Φ2 occurs before the trailing edge of Φ1, and the leading edge of Φ2 occurs after the trailing edge of Φ1.

Figure 17:
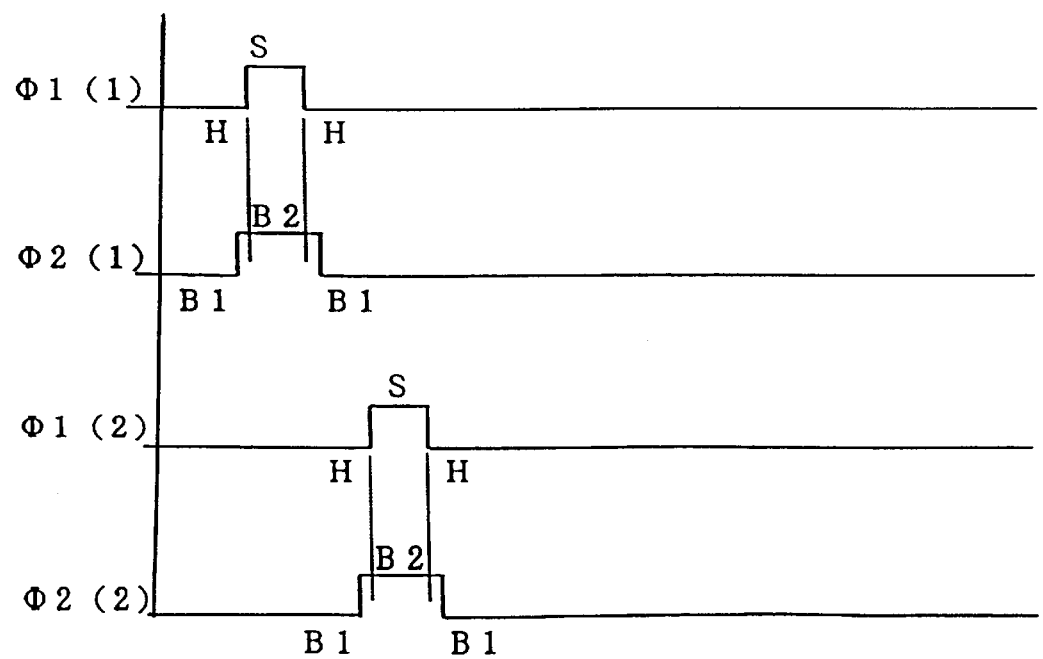
FIG. 17 is a timing chart of a switch in FIG. 12.

FIG. 17 is a timing chart of clocks Φ1(1), Φ2(1), Φ1(2), Φ2(2) for the sampling and holding circuits SH1' and SH2'. The references "S", "H", "B1" and "B2" are similar to those in FIG. 16. The sampling and holding circuits successively sample and hold the input voltage one after another. After "S" period of Φ1(1) and "B2" period of Φ2(1) synchronous thereto, Φ1(1) is kept "H" and Φ2(1) is kept "B1". Just after "S" period of Φ1(1) and "B2" period of Φ2(1), "H" and "B1" are changed to "S" and "B2", then return to "H" and "B1".

The signal Φ2 is used for saving power consumption similar to that in the third embodiment.

The current variable type operational amplifier can be applied to applications other than the sampling and holding circuits, such as to a circuit for optimizing current. Three or more bias voltages may be used. The bias voltage may be continuously variable for accurate adjustment of the current.

FIG. 18 is a block diagram showing a matched filter utilizing the circuit in FIGS. 11 to 17.

In FIG. 18, two series of sampling and holding circuits S11 to S1n and S21 to S2n are provided, to perform double sampling for Ain. Two series of sampling and holding circuits work in response to clocks CLK0 and CLK1 of the same frequency, respectively, and CLR1 is a half of a cycle shifted version of CLK0. The sampling and holding circuits of each series successively receive the analog signal one after another, with circulation. Therefore, only one of sampling and holding circuits of each series needs large current consumption.

Each pair of the corresponding sampling and holding circuits S11 and S21, S12 and S22, . . . , S1n and S2n are connected to corresponding selectors SEL1 to SELn, respectively, and one of series is selected. Outputs of the selectors SEL1 to SELn are input to one-input-two-outputs multiplexers MUX1 to MUXn, respectively. Each of the selectors selectively outputs the input to one of the outputs, positive side and negative side, in response to a spreading code for a spread spectrum communication. The outputs of the multiplexers MUX1 to MuXn are input to an adder ADD for subtracting a summation of the negative side data from a summation of the positive side data. An output Aout is output from the adder ADD.

The spreading code (PN code) is stored in a shift register SREG, the last stage of which is returned to the first stage. A clock CLKS becomes the clock CLK0 or CLK1 such that the data in the shift register SREG is shifted and circulated synchronously to the data sampling of sampling and holding circuits.

When new spreading code is to be input to the shift register, the clock CLKS is input, with inputting the new code from a data input Din.

The matched filter for a practical spread spectrum communication system has several hundreds to several thousands of sampling and holding circuits, and it is effective that only one sampling and holding circuit is supplied a sufficient current for decreasing electrical power consumption. This is a great advantage for mobile stations of the spread spectrum communication system.

What is claimed is:

1. A filter circuit comprising:

a plurality of sampling and holding circuits for sampling and holding an analog input signal with a predetermined sampling period to provide a plurality of sampling and holding signals;

a calculation circuit for multiplying each of said plurality of sampling and holding signals by a predetermined multiplier, and for summing said multiplication results; and a supply voltage coupled to said sampling and holding circuits, said supply voltage being decreased when sampling and holding circuits are holding.

2. A filter circuit as claimed in claim 1, wherein said multipliers are 1-bit, multiplies and said calculation circuit comprises:

a plurality of multiplexers corresponding to said sampling and holding circuits, each said multiplexer having a first and a second inputs and a first and a second outputs, said first input being connected to said first output and said second input being connected to a second output when said corresponding multiplier is "1", and said connection being reversed when said corresponding multiplier is "0", said first input being connected to said corresponding sampling and holding circuit, said second input being connected to a reference voltage;

a plurality of first switches corresponding to said multiplexers, each of which is connected to said first output of said multiplexer;

a plurality of second switches corresponding to said multiplexers, each of which is connected to said second output of said multiplexers;

a plurality of input capacitances corresponding to said multiplexers connected at an input parallel to said corresponding first and second switches;

a plurality of inverting amplifiers corresponding to said multiplexers, each of which is connected at an input to an output of said input capacitances;

a feedback capacitance connected between the output and said input of said inverting amplifier; and a plurality of refresh switches corresponding to said inverting amplifiers each for short-circuiting said corresponding inverting amplifier, wherein, during a first half of each said sampling period, said refresh switches and said first switches are closed and said second switches are opened, during a latter half of each said sampling period, said refresh switches and said first switches are opened and said second switches are closed, such that a summation of said analog input signal corresponding to said multipliers of "0"is subtracted from a summation of said analog input signal corresponding to said multipliers of "1".

3. A filter circuit as claimed in claim 1, wherein said calculation circuit comprises:

a plurality of multiplication circuits corresponding to said sampling and holding circuits, each of which multiplies said analog input signal by said predetermined multiplier;

a first adder for summing up outputs of said multiplication circuits;

a second adder for summing up analog input signals held in said sampling and holding circuits;

a first scaler for scaling an output of said second adder;

a third adder for adding an output of said first adder and an output of said first scaler; and a second scaler for scaling an output of said third adder.

4. A filter circuit as claimed in claim 3, wherein, a number of said sampling and holding circuits is L;

said multipliers are N-bit multipliers;

said multiplication circuits multiply said analog input signal by said predetermined multipliers after multiplying said analog input signal by $$\frac{1}{2^{N-1}};$$

said first adder sums up said outputs of said multiplication circuits after dividing said outputs by said L;

said second adder sums said analog input signal held in said sampling and holding circuits after dividing said analog input signal by said L;

said first scaler multiplies said output of said second adder by $$\frac{1}{2^{N-1}};$$

and said second scaler multiplies said output of said third adder by $$\frac{L}{2^{N-1}}.$$

5. A filter circuit comprising:

a plurality of sampling and holding circuits for sampling and holding an analog input signal to provide a plurality of sampling and holding signals;

multiplication circuits for multiplying each of said plurality of sampling and holding signals by a predetermined multiplier;

a first adder for summing outputs of said multiplication circuits;

a second adder for summing said plurality of sampling and holding signals;

a scaler for scaling an output of said second adder; and a third adder for adding an output of said scaler and an output of said first adder to provide an output signal.

6. A filter circuit as claimed in claim 1, each said sampling and holding circuit comprising:

a first FET operational amplifier, an output of which is connected to an inverted input, said first FET operational amplifier includes a current source MOS transistor for controlling a supply current of said first FET operational amplifier;

an input switch for connecting an input voltage to a non-inverted input of said first FET operational amplifier; and a bias switch connected to a plurality of bias voltages for selectively inputting one of said bias voltages to a gate of said current MOS transistor, such that said supply voltage is decreased when said sampling and holding circuit is holding.

7. A filter circuit as claimed in claim 6, further comprising:

a switch connected to an output of said first FET operational amplifier; and a second FET operational amplifier connected to an output of said switch, another output of which is connected to the inverted input of said second FET operational amplifier.

8. A filter circuit comprising:

a plurality of sampling and holding circuits for sampling and holding analog input signal with a predetermined sampling period;

a multiplier register for storing a plurality of 1-bit multipliers corresponding to said sampling and holding circuits, said multipliers being multiplied to said analog input signal in said sampling and holding circuits;

a plurality of multiplexers corresponding to said sampling and holding circuits, each said multiplexer having a first and a second inputs and a first and a second outputs, said first input being connected to said first output and said second input being connected to a second output when said corresponding multiplier is "1", and said connection being reversed when said corresponding multiplier is "0", said first input being connected to said corresponding sampling and holding circuit, said second input being connected to a reference voltage; and a plurality of subtraction circuits each for subtracting said second output from said first output of said multiplexers, each said subtraction circuit comprises:

a plurality of first switches corresponding to said multiplexers, each of which is connected to said first output of said multiplexer;

a plurality of second switches corresponding to said multiplexers, each of which is connected to said second output of said multiplexer;

a plurality of input capacitances corresponding to said multiplexers connected at an input parallel to said corresponding first and second switches;

a plurality of inverting amplifiers corresponding to said multiplexes, each of which is connected at its input to an output of said input capacitances;

a feedback capacitance connected between an output and said input of said inverting amplifier; and a plurality of refresh switches corresponding to said inverting amplifiers each for short-circuiting said corresponding inverting amplifier, wherein, during a first half of each said sampling period, said refresh switches and said first switches are closed and said second switches are opened, during a latter half of each said sampling period, said refresh switches and said first switches are opened and said second switches are closed, such that a summation of said analog input signal corresponding to said multipliers of "0" is subtracted from a summation of said analog input signal corresponding to said multipliers of "1".

9. A filter circuit as claimed in claim 8, said subtraction circuit comprising: p1 an inverting amplifier connected at an input parallel to said input capacitances; and a feedback capacitance connected between said input and an output of said inverting amplifier, whereby a summation of subtraction results is obtained.

10. A filter circuit as claimed in claim 8, further comprising an adder for summing up outputs of said plurality of subtraction circuits, said adder comprising:

a plurality of holding switches connected to outputs of said subtraction circuits;

an input capacitance to which said holding switches are parallel connected;

an inverting amplifier connected to an output of said input capacitance;

a feedback capacitance connected between an input and an output of said inverting amplifier; and a refresh switch for short-circuiting said feedback capacitance, wherein, during a first half of each said sampling period, said holding switches are opened, and during a latter half of each said sampling period, said holding switches are closed, so that an output of said filter circuit is generated based only on valid outputs of said subtraction circuits.

11. A filter circuit as claimed in claim 5, wherein:

a number of said sampling and holding circuits is L;

said multipliers are N-bit multipliers;

said multiplication circuits multiply said analog input signal by said predetermined multipliers after multiplying said analog input signal by $$\frac{1}{2^{N-1}};$$

said first adder sums said outputs of said multiplication circuits after dividing said outputs by said L;

said second adder sums said analog input signal held in said sampling and holding circuits after dividing said analog input signal by said L;

said first scaler multiplies said output of said second adder by $$\frac{1}{2^{N-1}};$$

and said second scaler multiplies said output of said third adder by $$\frac{L}{2^{N-1}}.$$

* * * * *